United States Patent [19]

Luyten et al.

[11] Patent Number: 4,712,066
[45] Date of Patent: Dec. 8, 1987

[54] METHOD FOR THE SELECTIVE EXCITATION OF A VOLUME IN AN OBJECT

[75] Inventors: Peter R. Luyten; Jan A. Den Hollander, both of Eindhoven, Netherlands

[73] Assignee: U.S. Philips Corporation, New York, N.Y.

[21] Appl. No.: 894,247

[22] Filed: Aug. 7, 1986

[30] Foreign Application Priority Data

Aug. 12, 1985 [NL] Netherlands .................. 8502223

[51] Int. Cl.$^4$ .................................. G01R 33/20
[52] U.S. Cl. ........................................... 324/309
[58] Field of Search ............... 324/307, 309, 310, 311, 324/313, 314

[56] References Cited

U.S. PATENT DOCUMENTS 4,431,968  2/1984  Edelstein et al. .................. 324/311
4,613,949  9/1986  Glover et al. ..................... 324/309

FOREIGN PATENT DOCUMENTS 0088970  9/1983  European Pat. Off. .
0046782  2/1984  European Pat Off. .

Primary Examiner—Stewart J. Levy
Assistant Examiner—Kevin D. O'Shea
Attorney, Agent, or Firm—Robert T. Mayer; Algy Tamoshunas

[57] ABSTRACT

Using the method in accordance with the invention a layer of an object is selected by means of a cycle comprising a non-selective 90° pulse, a dephasing gradient magnetic field, a non-selective 180° pulse and a selective 90° pulse in the presence of a similar gradient field. In the layer, a magnetization in the z-direction is obtained. Outside the object layer the transverse magnetization is totally dephased. By executing the cycle three times, during which the gradient directions of the three gradient fields used are mutually orthogonal, a "cube-like" volume is selected. High-resolution images of spin density distributions and T1 or T2 distributions can thus be realized and location-dependent spectroscopy is also possible.

6 Claims, No Drawings

METHOD FOR THE SELECTIVE EXCITATION OF A VOLUME IN AN OBJECT

The invention relates to a method for the selective excitation of a volume in an object which is arranged in a uniform, static magnetic field, after which r.f. electromagnetic pulses and gradient magnetic fields are generated for the selective excitation of said volume.

A method of this kind is described, for example, in "Journal of Magnetic Resonance" 56, pages 350-354 (1984) by W. P. Aue et al. According to the described method gradient magnetic fields are successively applied in the x-direction, the y-direction and the z-direction, a composite r.f. pulse being generated each time in the presence of such a gradient magnetic field. Each of the composite r.f. pulses comprises a succession of a selective 45° pulse, a wide-band 90° pulse and a selective 45° pulse. Following these three composite pulses, a "cube-like" volume whose position, orientation and magnitude are determined by the intensity of the uniform, static magnetic field, by the gradient intensity of the applied gradient magnetic fields and by the frequency (band) of the selective r.f. pulses, will have a magnetization which opposes its magnetization prior to the selective excitation (which was directed in the direction of the uniform, static magnetic field). One drawback of the known method is that the 90° non-selective r.f. pulse must be generated in the presence of a gradient magnetic field and should have a very high peak power. Generation of such an r.f. pulse imposes very severe requirements on the r.f. transmitter to be used. This in turn increases the cost of the equipment.

The known method has a further drawback in that the use of a very strong r.f. pulse is not compatible with safety requirements to be imposed (for high field intensities >0.5 T of the steady field). Furthermore, the method is based on sums of rotations of magnetizations of the spin nuclei caused by the various excitation pulses. In the selected volume of the object, and in the remainder of the object the excitation pulses should cause an overall rotation through angles of 540° and 270°, respectively, which they do not quite achieve. This is because the spin nuclei in the selected z-layer (gradient magnetic field Gz and two 45° selective pulses) are subjected to an overall rotation of 360° during the three composite pulses (with the exception of the sub-volume of the two orthogonal intersections with respect to the y-layer and the x-layer). The same is applicable to the spin nuclei in the selected z-layer and the x-layer. A 90° pulse generated after the three composite pulses in order to form a resonance or FID signal of the selected cube-like volume to be measured, therefore, will also cause resonance signals from said layers; this is a very disturbing phenomenon.

It is the object of the invention to provide a method which enables the selection of exclusively a desired volume, without a disturbing signal contribution to a generated resonance signal from matter surrounding the volume.

To achieve this, a method in accordance with the invention is characterized in that a non-selective 90° pulse is generated, after which a gradient magnetic field which dephases the spin nuclei is applied, after which a non-selective 180° pulse is generated and subsequently a selective 90° pulse in the presence of a gradient magnetic field having the same gradient direction. According to the method in accordance with the invention, the non-selective 90° pulse directs the magnetization in a plane transversely of the direction of the static uniform field. The dephasing gradient magnetic field subsequently applied dephases the spin nuclei in said plane. The effects of inhomogeneities of the static uniform magnetic field and the dispersion due to chemical shift ($\sigma$) are compensated for by means of the non-selective 180° pulse generated after the dephasing gradient magnetic field. The gradient magnetic field to be subsequently applied serves to cancel the dephasing introduced prior to the 180° pulse. The selective 90° pulse returns the magnetization of the spin nuclei in a layer co-determined by the gradient field to the original magnetization direction or a direction which opposes the original magnetization direction. In a layer to be preselected in the object a magnetization is thus obtained in the direction (or the opposite direction) of the uniform, static magnetic field. The transverse magnetization is totally dephased outside said layer.

It is to be noted that, when the non-selective 90° and 180° r.f. pulses have a frequency fo, the selective 90° r.f. pulse may have a frequency fo + $\Delta$f which deviates therefrom, so that so-called "off-centre" excitation takes place. When the gradient magnetic field has a gradient in the x-direction, a layer will be selected at a distance $\Delta$x from the layer which is excited with an r.f. pulse having a frequency fo, for which $2\pi.\Delta f = \gamma.G_x.\Delta x$. It is also to be noted that the excitation with the deviating frequency fo + $\Delta$f should be phase coherent with the first and second r.f. pulses having the frequency fo.

A version of a method in accordance with the invention is characterized in that the cycle comprising the non-selective 90° pulse, the dephasing gradient field, the non-selective 180° pulse and the selective 90° pulse is executed at least twice in the presence of a similar gradient field, the gradient magnetic field applied during each execution having a gradient direction which extends transversely of the gradient direction (directions) of the previously applied gradient magnetic field (fields).

According to a preferred version of the method, the cycle is executed three times and a "cube-like" volume within an object is selected. Within the "cube" a magnetization is obtained in the (opposite) direction of the static uniform magnetic field, while the transverse magnetization outside the "cube" is totally dephases. After a further excitation, the spin nuclei in the "cube" will generate a resonance signal which will not be influenced by the sum of spin nuclei present outside the "cube."

The preferred version of the method is particularly suitable for volume-selective spectroscopy. Because a signal is obtained exclusively from a selected volume during such measurements, the static uniform magnetic field can be very homogeneous in the volume, thus enabling spectroscopy with a very high spectral resolution.

The method in accordance with the invention is very suitable for realizing high-resolution images of spin density distributions and T1 and T2 distributions (T1 and T2 are the longitudinal and the transversal relaxation time constants, respectively).

A transversal relaxation time constant can be determined as follows. After the selection of, for example a cube-like volume, a 90° pulse is generated and after a waiting period $\tau$ a 180° pulse, so that after a period $\tau$ a maximum value of the resultant echo pulse will occur.

By repeating the above experiment, using each time different waiting periods τ, the transversal relaxation time constant T2 can be determined for the selected volume. It will be apparent that several modifications of the described method are feasible (for example, the determination of a T2 distribution in a selected volume).

The invention also provides a method of determining the longitudinal relaxation time constant T1. This may be done by first generating a 180° inversion pulse and then, after a waiting period τ, a volume is selected by means of a method described above; after a 90° excitation pulse the generated resonance signal (FID signal) is measured. The longitudinal relaxation time constant can be determined by repeating the above experiment a number of times using different waiting periods τ. The formation of high-resolution images necessitates selection in only one direction, provided that this direction is the same as the direction of the gradient magnetic field during the preparation phase of a measurement cycle as described in the European Patent Application No. 0 046 782.

Because signals are always received from a subvolume during the execution of the methods in accordance with the invention, the steady magnetic field can be made to be highly homogeneous in advance by means of, for example shim coils or other adjustment means, thus minimizing any resultant artefacts so that a very high resolution can be achieved. The methods in accordance with the invention also enable the use of a surface coil for detection of resonance signals generated rn a slice-like, bar-like or cube-like volume.

For state of the art methods and methods in accordance with the invention, the direction of the uniform steady field is defined as the Z-axis. The field direction of the gradient magnetic fields coincides with said Z-axis. The gradient directions of the usually three different gradient magnetic fields are the x-direction, the y-direction and the z-direction. The 90° pulses to be used for a method in accordance with the invention are, for example x-pulses, the selective 90° pulse being a −x-pulse while the non-selective 90° pulse is a +x-pulse. The non-selective 180° pulse is a y-pulse in that case. The non-selective 180° pulse is preferably formed by a combination of pulses, that is to say a 90° x-pulse, a 180° y-pulse and a 90° x-pulse (all non-selective pulses). The use and the notation of 90° x-pulses and 180° y-pulses is known per se and described, for example in "Polarisation Transfer Sequences for Two Dimensional NMR by Heisenberg Vector Analyses", Journal of Magnetic Resonance 45, 8–29 (1981) by M. R. Bendall et al.

It has been found to be advantageous to use a +x-pulse for the non-selective 90° pulse and a −x-pulse for the selective 90° pulse (or vice versa), because effects from outside the selected volume, for example due to imperfections of the steady magnetic field, are thus eliminated.

After selection of a given object volume and after excitation of the volume with a (for example 90°) excitation pulse, in the customary manner a resonance signal can be conditioned and measured, an echo signal can be formed, etc. (see, for example EP No. 088.970).

What is claimed is:

1. In a method for selective excitation of a region of an object which is arranged in a uniform, static magnetic field wherein r.f. electromagnetic pulses and gradient magnetic fields are generated for selective excitation of said region, the improvement comprising generating a non-selective 90° pulse, applying a gradient magnetic field which dephases spin nuclei, then generating a non-selective 180° pulse and subsequently genrating a selective 90 ° pulse in the presence of a similar gradient field.

2. A method as claimed in claim 1, wherein the cycle comprising the generation of the non-selective 90° pulse, the application of the dephasing gradient field, and the generation of the non-selective 180° pulse and the selective 90° pulse is executed at least twice in the presence of a similar gradient field, the gradient magnetic field applied during each execution having a gradient direction which extends transversely of the gradient direction of the previously applied gradient magnetic field.

3. A method as claimed in claim 1 wherein the 90° pulses are x-pulses.

4. A method as claimed in claim 1, 2 or 3, wherein the 180° pulses are y-pulses.

5. A method as claimed in claim 1, 2 or 3, wherein the 180° pulse is comprised of a 180°-y-pulse which is preceded and succeeded by a 90° x-pulse.

6. A method as claimed in claim 3, wherein the selective 90° pulse is a −x-pulse, the non-selective 90° pulse is a +x-pulse.

* * * * *